United States Patent
Kray

(10) Patent No.: US 10,546,078 B2
(45) Date of Patent: Jan. 28, 2020

(54) TURBOFAN CASE FOR CONTROLLING BLADE DEFLECTION

(71) Applicant: General Electric Company, Schenectady, NY (US)

(72) Inventor: Nicholas Joseph Kray, Mason, OH (US)

(73) Assignee: General Electric Company, Schenectady, NY (US)

( * ) Notice: Subject to any disclaimer, the term of this patent is extended or adjusted under 35 U.S.C. 154(b) by 402 days.

(21) Appl. No.: 15/405,965

(22) Filed: Jan. 13, 2017

(65) Prior Publication Data

US 2018/0202460 A1  Jul. 19, 2018

(51) Int. Cl.
| | | |
|---|---|---|
| G06F 17/50 | (2006.01) | |
| F04D 29/52 | (2006.01) | |
| F02K 3/06 | (2006.01) | |
| G06G 7/64 | (2006.01) | |

(52) U.S. Cl.
CPC ............ *G06F 17/5018* (2013.01); *F02K 3/06* (2013.01); *F04D 29/526* (2013.01); *G06G 7/64* (2013.01); *F05D 2220/323* (2013.01); *F05D 2220/36* (2013.01); *F05D 2260/81* (2013.01); *F05D 2270/09* (2013.01)

(58) Field of Classification Search
CPC .......... F02K 3/06; F04D 29/526; G06G 7/64; G06F 17/5018; F05D 2220/323; F05D 2220/36; F05D 2260/81; F05D 2270/09
See application file for complete search history.

(56) References Cited

U.S. PATENT DOCUMENTS

| | | | |
|---|---|---|---|
| 4,304,093 A | 12/1981 | Schulze | |
| 5,601,402 A | 2/1997 | Wakeman et al. | |
| 6,853,945 B2 | 2/2005 | Namburi | |
| 7,686,569 B2 | 3/2010 | Paprotna et al. | |
| 7,837,429 B2 | 11/2010 | Zhang et al. | |
| 7,909,566 B1 | 3/2011 | Brostmeyer | |
| 8,065,022 B2 | 11/2011 | Minto et al. | |
| 8,672,609 B2 | 3/2014 | Lussier et al. | |
| 2003/0156940 A1* | 8/2003 | Czachor | F01D 21/045 415/119 |
| 2016/0040538 A1* | 2/2016 | Chen | F01D 5/288 60/805 |
| 2016/0305266 A1* | 10/2016 | Zywiak | F01D 11/001 |
| 2018/0135646 A1* | 5/2018 | Raghavan | C23C 4/04 |

FOREIGN PATENT DOCUMENTS

| | | |
|---|---|---|
| EP | 1004750 | 5/2000 |
| WO | WO2009044542 | 1/2008 |
| WO | WO2013049143 | 4/2013 |

* cited by examiner

*Primary Examiner* — Jason D Shanske
*Assistant Examiner* — Sang K Kim
(74) *Attorney, Agent, or Firm* — General Electric; James Reed

(57) ABSTRACT

A containment structure configured to provide close tolerance for a rotation structure. The containment structure includes an annular inner casing having an inner annular surface being formed of an abradable material. The rotation structure is configured to be received within the annular inner casing such that the rotation structure is normally spaced-apart from the inner annular surface. The inner annular surface surrounds the rotation structure and has a first width. The rotation structure has a second width and the first width is greater than the second width. At least a section of the inner annular surface of the abradable material is cylindrical.

10 Claims, 4 Drawing Sheets

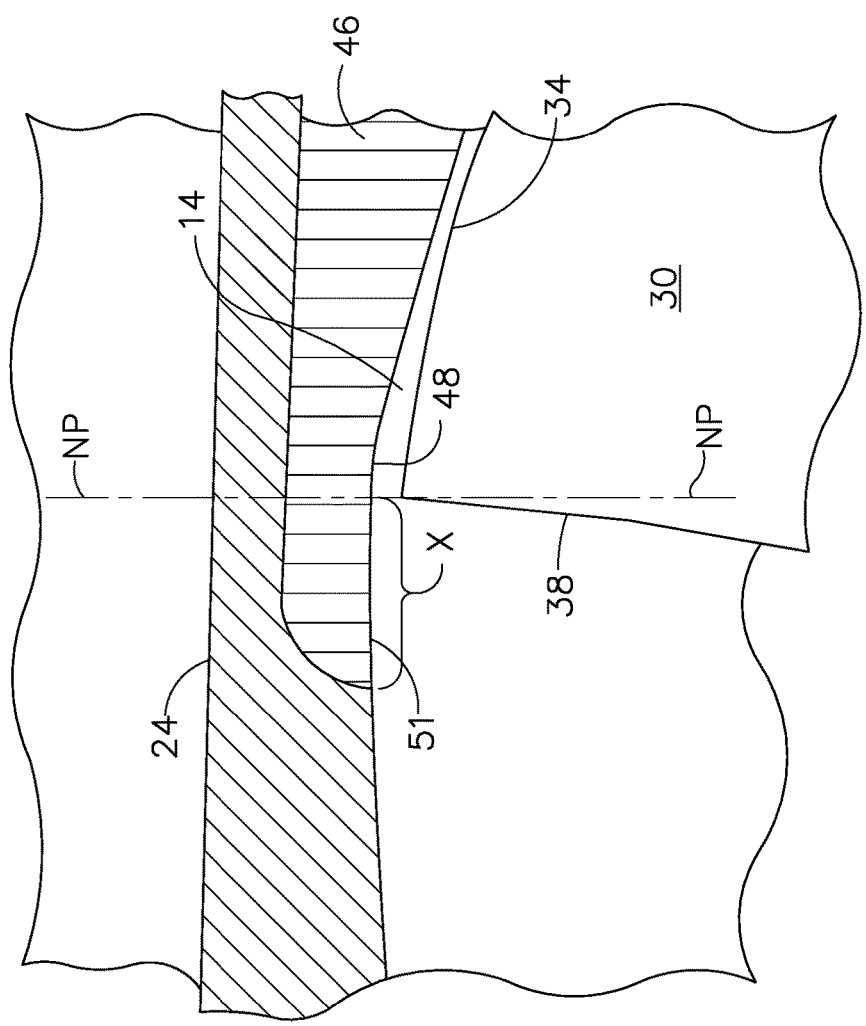

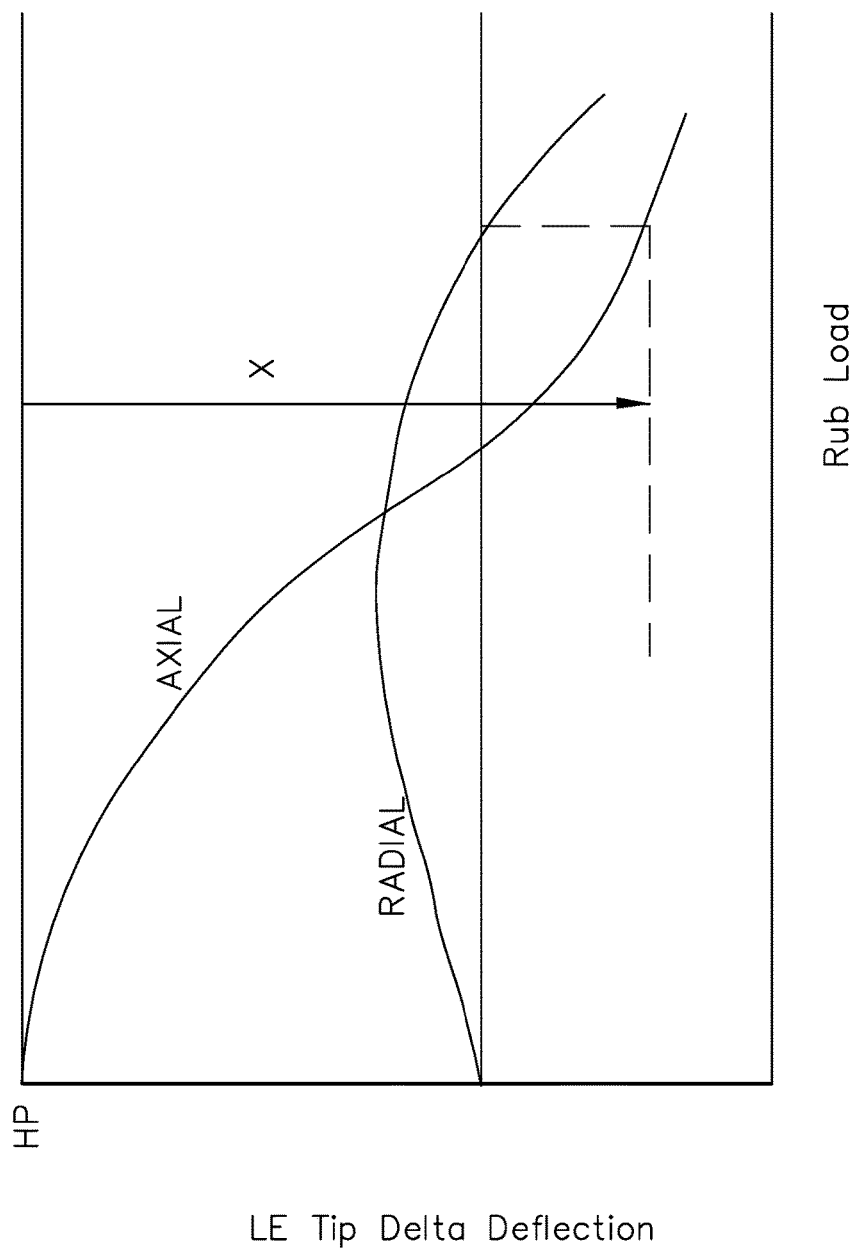

TURBOFAN CASE FOR CONTROLLING BLADE DEFLECTION

BACKGROUND OF THE INVENTION

The present invention relates to abradable shroud assemblies for use in turbomachinery, such as gas turbine engines. More particularly, this invention relates to a geometric profile of a containment case in regions forward of where a rotating blade row is aligned.

In most turbofan engines the fan is contained by a fan case that is equipped with a shroud. The shroud circumscribes the fan and is adjacent to the tips of the fan blades. The shroud serves to channel incoming air through the fan so as to ensure that most of the air entering the engine will be compressed by the fan. A small portion of the air is able to bypass the fan blades through a radial gap present between the tips of the fan blades and the shroud. Conventionally, the radial gap is very narrow such that the amount of air that is able to bypass the fan through the gap is limited. The efficiency of the engine can be significantly improved in this way.

Because the gap is narrow, the fan blades may rub the shroud during the normal operation of an aircraft turbofan engine. An abradable material is configured into the shroud for this purpose. However, any rubbing contact between the tips of the fan blades and the shroud will tend to cause the fan blades to deflect and eventually become unstable. Such rubbing events can be self-feeding as the blade continues to deflect during the event. Therefore there is a need for a shroud that is configured to minimize the frequency and severity of rub events during operation.

BRIEF DESCRIPTION OF THE INVENTION

This need is addressed by a shroud that includes a generally cylindrical abradable region positioned forward of the rotating blades.

According to one aspect of the present invention, there is provided a containment structure configured to provide close tolerance for a rotation structure. The containment structure includes an annular inner casing having an inner annular surface being formed of an abradable material. The rotation structure is configured to be received within the annular inner casing such that the rotation structure is normally spaced-apart from the inner annular surface. The inner annular surface surrounds the rotation structure and has a first width. The rotation structure has a second width and the first width is greater than the second width. At least a section of the inner annular surface of the abradable material is cylindrical.

According to another aspect of the present invention there is provided a method for determining the geometric configuration of a fan containment structure of a turbofan engine including the steps of: modeling the operation of a turbofan engine; simulating a rub load condition; measuring blade deflection, both radial and relative to an axis of the engine of a fan; and determining the axial distance X of the blade deflection.

BRIEF DESCRIPTION OF THE DRAWINGS

The invention may be best understood by reference to the following description taken in conjunction with the accompanying drawing figures in which:

FIG. 3 is an enlarged view of a portion of FIG. 2; and FIG. 4 is a graph showing the relationship between actual blade deflection and rub load.

DETAILED DESCRIPTION OF THE INVENTION

Figure 1:
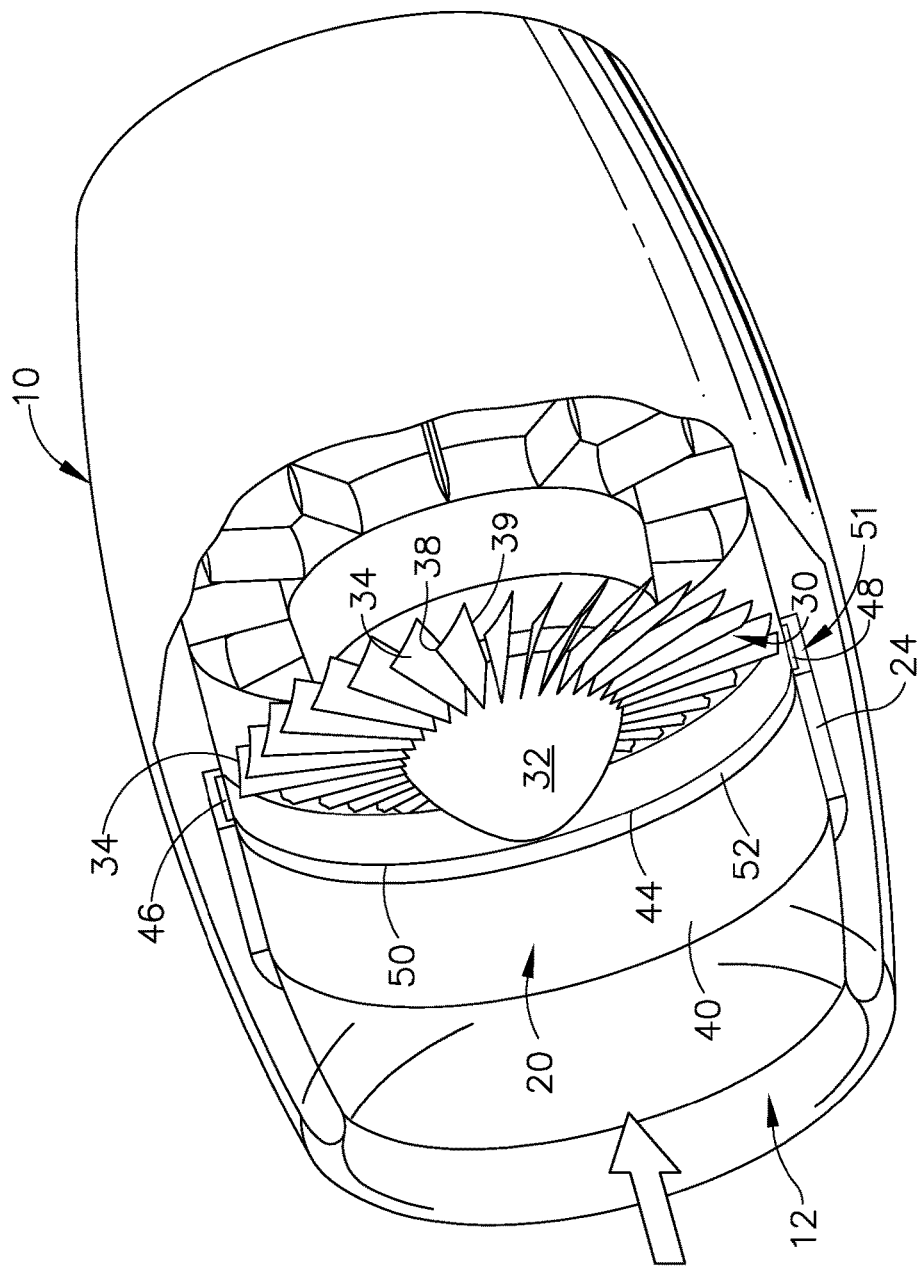
FIG. 1 is an enlarged partial view of the fan section of a turbofan engine.
Figure 2:
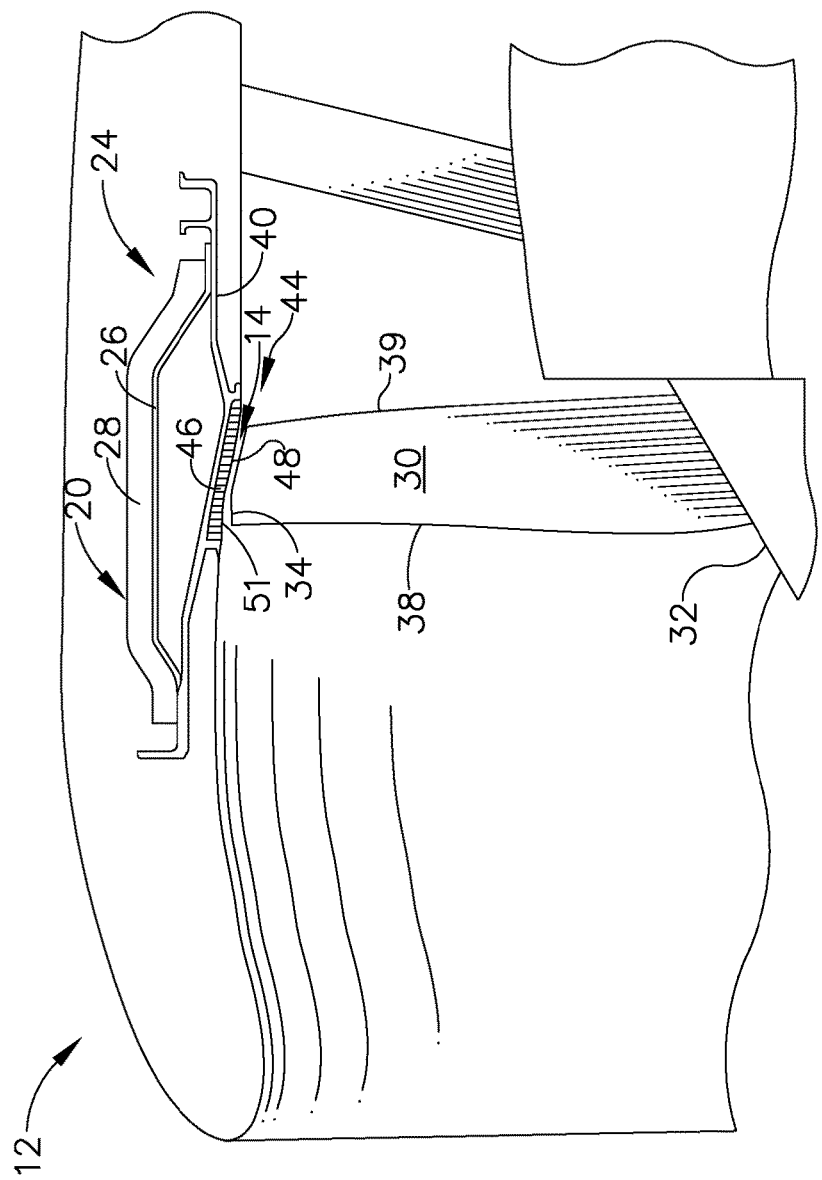
FIG. 2 is a cut away sectional view of a turbofan engine showing the contoured surface of the fan shroud.

Referring to the drawings wherein identical reference numerals denote the same elements throughout the various views, FIG. 1 illustrates an abradable fan containment structure 20 for use in turbomachinery, such as a high bypass turbofan engine 10 shown in FIG. 1. The containment structure 20 can be used in other machinery that includes a rotation structure such as pumps, compressors, or turbomachinery. In the configuration shown, the engine 10 includes a rotation structure that is a fan 12 and a fan case 24. The fan 12 includes a plurality of fan blades 30. The fan blades 30 are mounted to a fan disk 32 which is located within the fan section 12 of the engine 10. In the configuration shown, the engine 10 includes a rotating structure that is a fan 12 and a plurality of fan blades 30. The fan blades 30 are mounted to the fan disk 32.

The fan blades 30 include blade tips 34 that define a circular path that has an outer diameter. The blades 30 are configured such that the blade tips 34 are positioned a first predetermined distance from the axis of the engine at a leading edge 38 and tapered to a second predetermined distance from the centerline axis of the engine at a trailing edge 39 of the blade 30. The first predetermined distance may be greater than the second predetermined distance.

A containment structure 20 circumscribes the fan blades 30 and includes a forward fan case 24. The forward fan case 24 has an inner fan casing 40 that is usually made of aluminum, surrounded by an aluminum honeycomb surrounded by a graphite epoxy outer fan casing 26 surrounded by a KEVLAR cover 28. The fan case can also be made of a composite material. The inner fan case 40 includes a fan shroud 44. The fan shroud 44 includes abradable material 46 that defines an inner annular surface 48 in a first section. The abradable material 46 may be any suitable abradable material of the type known and used in the prior art, including composite materials, or the like. The abradable material 46 is preferably provided in the form of one or more solid panels though it can be formed from a loose material.

The inner annular surface 48 has a generally circular cross-section and defines an inner diameter of the inner casing 40. The fan shroud 44 is configured to channel the incoming air through the fan 12 so as to ensure that the fan 12 will compress the bulk of the air entering the engine 10.

Preferably, a small radial gap 14 is present between the tips 34 of the fan blades 30 and the abradable material 46. It is this clearance, i.e., the radial gap 14, that is minimized in order to promote the efficiency of the engine 10.

The radial gap 14 is defined by the position of blade tips 34 and the inner annular surface 48. As indicated above, the blades 30 each taper from the leading edge to the trailing edge at the blade tips 34. Thus for each axial location, radial gap 14 is defined by the relative positions of a blade tip 34 and the inner annular surface 48 at that axial location. According to the illustrated embodiment, the radial gap is constant. This is because the ID of the inner casing 40 reduces as axial locations are moved aft to match the taper of the blade tips 34. It should be noted that for some embodiments, the radial gap is variable.

Referring now to FIG. 3, when the blades 30 are at normal operating conditions, the location of the leading edge of the blades 30 at the blade tips 34 defines a normal plane "NP". The annular surface 48 first section tapers to generally match the profile of the tip 34 from the normal plane to a position near the trailing edge 39. Forward of the normal plane abradable material 46 defines a second section that is a cylindrical surface 51 in a second section. The surface 51 extends forward of the leading edge 38 and has a width X. The width X is determined in accordance with the method described below.

Conventionally the inner diameter of the fan case 24 gradually reduces moving forward axially from the normal plane in order to provide better aerodynamic properties The invention can be better understood through a description of a method of determining the dimension X. As used, the term "axial deflection" refers to the distance a blade tips 34 moves away from the normal plane in a direction that is generally perpendicular to the normal plane. This direction is also generally parallel to the centerline of the engine. In short, the dimension X is generally equal to maximum amount of forward axial deflection that occurs in the blades 30 when a rubbing load is applied to the blades 30 in a running condition. Such a load in actual running conditions would occur when at least one of the blades 30 contacts, i.e., rubs, against the abradable material 46.

To determine the distance X for a particular engine 10, the performance of the engine 10 is modeled via a computer simulation. In a first step, normal run conditions are simulated for the engine 10. Then a rub load is simulated for the engine 10 and the blades 30. As a result of the rub load, the blades 30 will deflect and such deflection is measured in the model.

As can be seen in FIG. 4, the blade LE initial deflection is both axial forward and radially outward as the rub load begins to be applied. As the amount of rub load is increased the radial deflection of the blade hits a maximum condition then begins to decrease whereas the axial deflection continues to increase FWD of axial plane NP. When the blade radial deflection passes back thru its radial starting point the physical blade is no longer contacting the case and theoretically the rub load would decrease. This rub load point is used to determine the distance X that must define the abradable profile to ensure this self-feeding effect of rub load is eliminated.

When a rubbing event occurs, the rub load eventually increases to the point where the blades 30 deflects forward. The cylindrical section 51 is configured to operate to provide clearance to the blades 30 as they deflect forward. Thus as the blades 30 deflect forward they contact less material and the rub load is less than it would have been if the section forward of the normal plane was conventionally configured.

The advantage of the containment case profile of the present invention over the prior art is that the interaction of the blades in the case is controlled during rub events. By predicting the leading edge blade deflection during a rub event, the cylindrical dimensions of the containment case portion can be determined. This allows for avoidance of unstable rubs which are characterized by a self-defeating event where the blade continues to deflect as rubbing occurs. Such a self-feeding rub event can result in large rotor loads in cause unbalance, blade distress and eventual dynamic instability.

The foregoing has described an apparatus, i.e., a containment case for use in turbomachinery, that includes an abradable shroud having a predetermined geometric profile forward of a normal plane defined by a fan. All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying potential points of novelty, abstract and drawings), or to any novel one, or any novel combination, of the steps of any method or process so disclosed.

What is claimed is:

1. A method of making a containment structure of a fan comprising the steps of:
   modeling operation of the fan;
   simulating a rub load condition between a fan blade of the fan and the containment structure;
   measuring simulated axial deflection of the fan blade measured relative to a normal plane defined by an axial position of a leading edge of the fan blade at a blade tip thereof during a normal condition;
   providing the fan containment structure with a first tapered abradable section that extends aft of the normal plane and a second abradable section that extends forward of the normal plane; and
   wherein the second abradable section has a width generally equal to the simulated axial deflection.

2. The method according to claim 1, wherein the axial location of the normal plane is determined when an engine is in an operational state.

3. The method according to claim 1, further comprising the step of measuring blade deflection relative to a radial position of an engine.

4. The method of claim 1 wherein the second abradable section is cylindrical.

5. The method of claim 1, wherein a prime mover is coupled to the fan to drive the fan in flight.

6. The method of claim 5, wherein the prime mover is a gas turbine engine.

7. A method of making a fan assembly having:
   a containment structure that includes an abradable annular surface;
   a fan that is positioned within the containment structure and that includes a disk and a plurality of blades mounted to the disk; and
   the blades having a leading edge that defines a normal plane;
   the method comprising:
   modeling operation of the fan assembly;
   simulating a rub load condition between the plurality of blades and the containment structure;
   providing the abradable annular surface with a first tapered section that extends aft of the normal plane and a second section that extends forward of the normal plane; and
   wherein the second section has a width generally equal to the simulated axial deflection.

8. The method of claim 7, wherein the second section of the abradable annular surface is positioned to the first section of the abradable annular surface.

9. The method of claim 7, wherein a prime mover is coupled to the fan to drive the fan in flight.

10. The method of claim 9, wherein the prime mover is a gas turbine engine.

* * * * *